United States Patent
Fujio et al.

(10) Patent No.: US 9,865,715 B2
(45) Date of Patent: Jan. 9, 2018

(54) EPITAXIAL WAFER FOR HETEROJUNCTION BIPOLAR TRANSISTOR AND HETEROJUNCTION BIPOLAR TRANSISTOR

(71) Applicant: SUMITOMO CHEMICAL COMPANY, LIMITED, Tokyo (JP)

(72) Inventors: Shinjiro Fujio, Hitachi (JP); Takeshi Meguro, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/312,946

(22) PCT Filed: May 26, 2015

(86) PCT No.: PCT/JP2015/065060
§ 371 (c)(1),
(2) Date: Nov. 21, 2016

(87) PCT Pub. No.: WO2015/182592
PCT Pub. Date: Dec. 3, 2015

(65) Prior Publication Data
US 2017/0200816 A1   Jul. 13, 2017

(30) Foreign Application Priority Data
May 26, 2014   (JP) ................................. 2014-108047

(51) Int. Cl.
*H01L 29/737*   (2006.01)
*H01L 29/205*   (2006.01)
(Continued)

(52) U.S. Cl.
CPC ...... *H01L 29/7378* (2013.01); *H01L 29/1004* (2013.01); *H01L 29/205* (2013.01); *H01L 29/66242* (2013.01)

(58) Field of Classification Search
CPC ........... H01L 29/7371; H01L 29/66318; H01L 29/2003; H01L 21/02505; H01L 29/205;
(Continued)

(56) References Cited

U.S. PATENT DOCUMENTS 6,765,242 B1 *  7/2004  Chang ............... H01L 29/66318
                                                         257/197

FOREIGN PATENT DOCUMENTS

| JP | 3-124033 A | 5/1991 |
|---|---|---|
| JP | 6-069220 A | 3/1994 |

(Continued)

OTHER PUBLICATIONS

International Search Report (PCT/ISA/210) issued in PCT/JP2015/065060, dated Aug. 18, 2015.
(Continued)

*Primary Examiner* — Sonya D McCall Shepard
(74) *Attorney, Agent, or Firm* — Birch, Stewart, Kolasch & Birch, LLP

(57) ABSTRACT

An epitaxial wafer for a heterojunction bipolar transistor and a heterojunction bipolar transistor that are capable of further reducing a turn-on voltage are provided. An epitaxial wafer for a heterojunction bipolar transistor includes a collector layer made of GaAs, a base layer formed on the collector layer and made of InGaAs, and an emitter layer formed on the base layer and made of InGaP, and the base layer has an In composition that decreases from the emitter layer side toward the collector layer side.

14 Claims, 3 Drawing Sheets

(51) Int. Cl.
*H01L 29/10* (2006.01)
*H01L 29/66* (2006.01)

(58) Field of Classification Search
CPC . H01L 29/1004; H01L 29/0817; H01L 33/30;
H01L 29/0821; H01L 29/66242; H01L
21/02543; H01L 21/02439; H01L 29/737;
H01L 29/73; H01L 29/7317; H01L
29/732
See application file for complete search history.

(56) References Cited

FOREIGN PATENT DOCUMENTS

| JP | 2002-270817 A | 9/2002 |
| JP | 2003-273118 A | 9/2003 |
| JP | 2005-150487 A | 6/2005 |

OTHER PUBLICATIONS

International Preliminary Report on Patentability and English Translation of the Written Opinion of the International Searching Authority (PCT/IB/326, PCT/IB/373, PCT/ISA/237), dated Dec. 8. 2016, for International Application No. PCT/JP2015/065060.
Japanese Notification of Reasons for Refusal (including an English translation thereof) issued in the corresponding Japanese Patent Application No. 2014-108047 dated Jul. 4, 2017.

\* cited by examiner

EPITAXIAL WAFER FOR HETEROJUNCTION BIPOLAR TRANSISTOR AND HETEROJUNCTION BIPOLAR TRANSISTOR

TECHNICAL FIELD

The present invention relates to an epitaxial wafer for a semiconductor transistor and to the semiconductor transistor and, in particular, relates to an epitaxial wafer for a heterojunction bipolar transistor and to a heterojunction bipolar transistor.

BACKGROUND ART

As a heterojunction bipolar transistor (HBT) in which a group III-V compound semiconductor is used, an InGaP/GaAs heterojunction bipolar transistor is widely used in which an emitter layer made of InGaP, which is a wide band gap semiconductor, is employed and other layers are made of GaAs in order to increase the current gain and the current injection efficiency.

In such an InGaP/GaAs heterojunction bipolar transistor, employing a base layer made of InGaAs having a smaller band gap than GaAs makes it possible to reduce a turn-on voltage (see, for example, Patent Literatures 1 through 3).

LISTING OF REFERENCES

PATENT LITERATURE 1: Japanese Patent Application Laid-Open Publication (Kokai) No. 2003-273118 A
PATENT LITERATURE 2: Japanese Patent Application Laid-Open Publication (Kokai) No. 2005-150487 A
PATENT LITERATURE 3: Japanese Patent Application Laid-Open Publication (Kokai) No. Hei 3-124033 A

SUMMARY OF THE INVENTION

Problems to be Solved by the Invention

As described above, employing a base layer made of InGaAs, instead of a base layer made of GaAs, makes it possible to reduce a turn-on voltage. In this case, however, the lattice constant of InGaAs constituting the base layer differs from the lattice constant of GaAs constituting other layers (except for an emitter layer), and thus accumulation of distortion increases as the film thickness of the base layer increases.

When the film thickness of the base layer exceeds a certain film thickness (hereinafter, referred to as a "critical film thickness"), accumulation of distortion becomes intolerable, and a dislocation occurs in order to mitigate the distortion. As a result, the occurrence of a dislocation degrades the crystallinity, which in turn results in an increase in a turn-on voltage.

Taking the above mentioned circumstances into account, accordingly, the present invention is directed to providing an epitaxial wafer for a heterojunction bipolar transistor and a heterojunction bipolar transistor that are capable of further reducing a turn-on voltage.

Solution to Solve the Problems

The present invention made to achieve the above mentioned object provides an epitaxial wafer for a heterojunction bipolar transistor. According to one aspect of the present invention, there is provided an epitaxial wafer including a collector layer made of GaAs, a base layer formed on the collector layer and made of InGaAs, and an emitter layer formed on the base layer and made of InGaP. In the epitaxial wafer, the base layer has an In composition that decreases from the emitter layer toward the collector layer.

According to another aspect of the present invention, it is preferable that a difference between a maximum value and a minimum value of the In composition of the base layer may be equal to or less than 0.06.

According to yet another aspect of the present invention, it is preferable that a mean value of the In composition of the base layer spanning from the emitter layer to the collector layer may be no less than 0.16 nor more than 0.22.

According to yet another aspect of the present invention, it is preferable that the In composition of the base layer at an interfacial surface between the base layer and the emitter layer be 0.20.

According to yet another aspect of the present invention, it is preferable that the base layer have a film thickness that is equal to or less than a critical film thickness.

According to yet another aspect of the present invention, it is preferable that the In composition of the base layer decrease continuously or in a stepwise manner from the emitter layer toward the collector layer.

According to yet another aspect of the present invention, there is also provided a heterojunction bipolar transistor fabricated with the use of the epitaxial wafer for the heterojunction bipolar transistor.

MODE FOR CARRYING OUT THE INVENTION

Hereinafter, preferred embodiments of the present invention will be described in detail with reference to the appended drawings.

Figure 1:
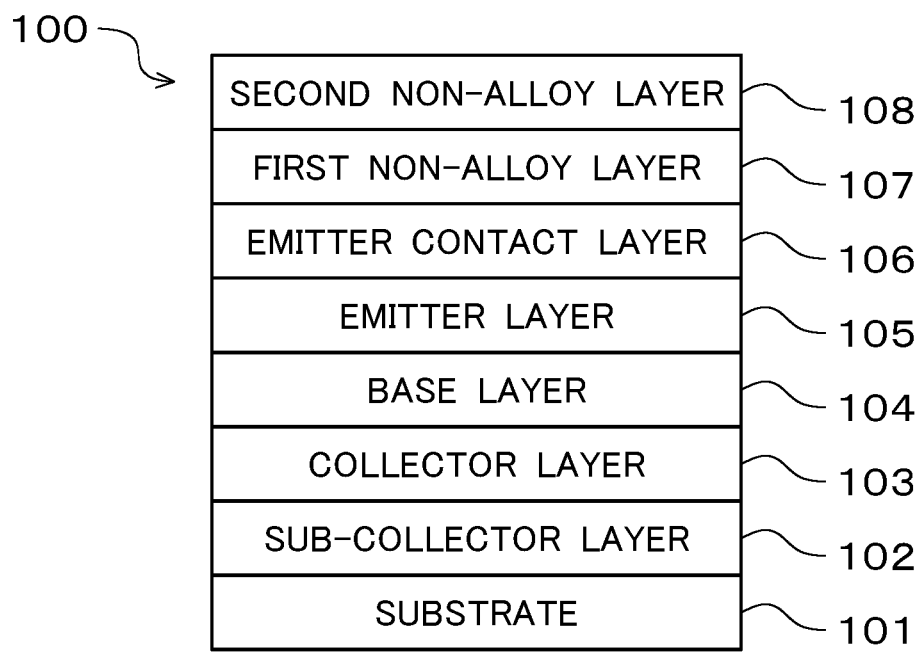
FIG. 1 is a schematic diagram illustrating a structure of an epitaxial wafer for a heterojunction bipolar transistor according to an embodiment of the present invention.

As illustrated in FIG. 1, an epitaxial wafer 100 for a heterojunction bipolar transistor according to a preferred embodiment of the present invention includes a substrate 101 made of a semi-insulating GaAs, a sub-collector layer 102 formed on the substrate 101 and made of GaAs, a collector layer 103 formed on the sub-collector layer 102 and made of GaAs, a base layer 104 formed on the collector layer 103 and made of InGaAs, an emitter layer 105 formed on the base layer 104 and made of InGaP, an emitter contact layer 106 formed on the emitter layer 105 and made of GaAs, a first non-alloy layer 107 formed on the emitter contact layer 106 and made of InGaAs, and a second non-alloy layer 108 formed on the first non-alloy layer 107 and made of InGaAs. The base layer 104 has an In composition that decreases from the emitter layer 105 toward the collector layer 103.

In other words, although employing an In composition profile of positive inclination in which the In composition increases from an emitter layer 105 toward a collector layer 103 in order to reduce an internal electric field has been conventionally known (see, for example, Patent Literature 3), it is of great importance in the present invention that an In composition profile that is exactly the opposite to the above be employed.

From the viewpoint of reducing a turn-on voltage, the In composition of the base layer 104 may simply be increased in order to lower the energy barrier at an interfacial surface between the base layer 104 and the emitter layer 105. However, as the In composition of the base layer 104 increases, the accumulation of distortion increases accordingly, and when the In composition of the base layer 104 exceeds a certain value, the crystallinity is degraded along with an occurrence of a dislocation, which leads to an increase in the turn-on voltage inversely.

With this respect, in the epitaxial wafer 100 for a heterojunction bipolar transistor, the In composition of the base layer 104 decreases from the emitter layer 105 toward the collector layer 103, or in other words, the turn-on voltage can be reduced by increasing the In composition of the base layer 104 at the interfacial surface between the base layer 104 and the emitter layer 105, and the accumulation of distortion that could arise due to a difference in the lattice constant can be suppressed by reducing the In composition of the base layer 104 at the interfacial surface (interface) between the base layer 104 and the collector layer 103. As a result, the turn-on voltage can be further reduced while preventing the crystallinity from being degraded due to an occurrence of a dislocation by keeping the accumulation of distortion to a minimum.

In this regard, it is preferable that a difference between a maximum value and a minimum value of the In composition of the base layer 104 be equal to or less than 0.06. The reason for this is as follows. When the difference between the maximum value and the minimum value of the In composition of the base layer 104 exceeds 0.06, then a current decreases as the internal electric field of the base layer 104 is enhanced in the reverse direction, and the turn-on voltage becomes higher than that of an epitaxial wafer for a heterojunction bipolar transistor according to a conventional technique in which the In composition of a base layer 104 is uniform from the emitter layer 105 to the collector layer 103.

Also, it is preferable that a mean value of the In composition of the base layer 104 spanning from the emitter layer 105 to the collector layer 103 be no less than 0.16 nor more than 0.22, and in particular it is desirable that the stated mean value be no less than 0.18 nor more than 0.20 within which the turn-on voltage can be reduced by up to 10 mV. The reason for this is as follows. When the mean value of the In composition from the emitter layer 105 to the collector layer 103 is less than 0.16 or otherwise more than 0.22, even if the difference between the maximum value and the minimum value of the In composition of the base layer 104 is equal to or less than 0.06, the energy barrier at the interfacial surface between the base layer 104 and the emitter layer 105 cannot be lowered to a sufficient level, and the crystallinity is degraded due to an occurrence of a dislocation. Thus, the turn-on voltage becomes higher than that of an epitaxial wafer for a heterojunction bipolar transistor according to a conventional technique.

Furthermore, it is preferable that the In composition of the base layer 104 at the interfacial surface between the base layer 104 and the emitter layer 105 be 0.20. The reason for this is as follows. In an epitaxial wafer for a heterojunction bipolar transistor according to a conventional technique, the turn-on voltage can be minimized by setting the In composition of a base layer 104 to 0.18, and thus it is conceivable that the turn-on voltage can be made comparable to that of the conventional technique by setting the In composition of the base layer 104 at the interfacial surface between the base layer 104 and the emitter layer 105 to 0.18 in the epitaxial wafer 100 for a heterojunction bipolar transistor as well, and the turn-on voltage can be minimized with the In composition of 0.20.

Also, it is preferable that the film thickness of the base layer 104 be no greater than the critical film thickness. As described above, when the film thickness of the base layer 104 exceeds the critical film thickness, then the accumulation of distortion becomes intolerable, and a dislocation occurs in order to mitigate the distortion. The occurrence of a dislocation degrades the crystallinity, which in turn results in an increase in the turn-on voltage.

The base layer 104 has an In composition that decreases continuously or in a stepwise manner from the emitter layer 105 toward the collector layer 103. For example, the In composition of the base layer 104 may be varied monotonically from the emitter layer 105 toward the collector layer 103, the In composition of the base layer 104 may be varied greatly near the interfacial surface between the base layer 104 and the emitter layer 105, or the base layer 104 may be formed by stacking a layer in which the In composition is inclined and a layer in which the In composition is uniform.

With the configuration described above, according to the epitaxial wafer 100 for a heterojunction bipolar transistor according to the present embodiment, the turn-on voltage can be further reduced.

Figure 2:
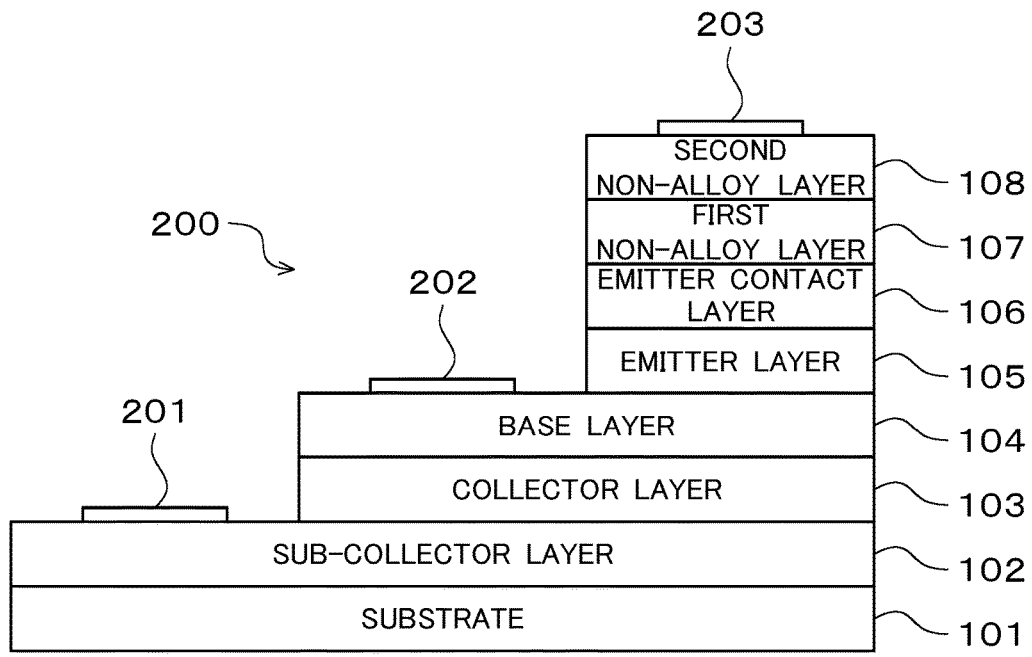
FIG. 2 is a schematic diagram illustrating a structure of a heterojunction bipolar transistor according to an embodiment of the present invention.

As illustrated in FIG. 2, while using the epitaxial wafer 100 for a heterojunction bipolar transistor, a heterojunction bipolar transistor 200 can be obtained by forming a collector electrode 201 on the sub-collector layer 102, forming a base electrode 202 on the base layer 104, and forming an emitter electrode 203 on the second non-alloy layer 108.

According to this heterojunction bipolar transistor 200, the turn-on voltage can be further reduced.

Concrete Examples

Hereinafter, the basis for the numerical limitations according to the present invention will be described.

Herein, "n" is affixed when an epitaxial layer is of n-type, and "p" is affixed when an epitaxial layer is of p-type. In addition, a case in which the impurity density is relatively high is indicated by "+", and a case in which the impurity density is relatively low is indicated by "−."

Inventors according to the present invention fabricated an epitaxial wafer for a heterojunction bipolar transistor through a metal organic vapor phase epitaxy (MOVPE) method by epitaxially growing in order, on a substrate made of semi-insulating GaAs, a sub-collector layer made of $n^+$-GaAs, a collector layer made of $n^-$-GaAs, a base layer made of $p^+$-$In_xGa_{1-x}$As, an emitter layer made of $n^-$-$In_{0.484}Ga_{0.516}$P, an emitter contact layer made of $n^+$-GaAs, a first non-alloy layer made of $n^+$-$In_{0.5}Ga_{0.5}$As, and a second non-alloy layer made of $n^+$-$In_{0.5\rightarrow0}Ga_{0.5\rightarrow1}$As.

Fabricated were the epitaxial wafers for a heterojunction bipolar transistor in each of which the sub-collector layer had a film thickness of 500 nm and a carrier concentration of $3\times10^{18}$ $cm^{-3}$, the collector layer had a film thickness of 500 nm and a carrier concentration of $1\times10^{16}$ $cm^{-3}$, the base layer had a film thickness of 50 nm and a carrier concentration of $4\times10^{19}$ $cm^{-3}$, the emitter layer had a film thickness of 30 nm and a carrier concentration of $3\times10^{17}$ $cm^{-3}$, the emitter contact layer had a film thickness of 100 nm and a carrier concentration of $3\times10^{18}$ $cm^{-3}$, the first non-alloy layer had a film thickness of 40 nm and a carrier concentration of $2\times10^{19}$ cm$^{-3}$, the second non-alloy layer had a film thickness of 40 nm and a carrier concentration of $2\times10^{19}$ cm$^{-3}$, and the base layer had an In composition x that was uniform from the emitter layer to the collector layer; and the In composition was varied among 0.10, 0.12, 0.14, 0.16, 0.18, 0.20, and 0.22. The turn-on voltage of each of these epitaxial wafers for a heterojunction bipolar transistor was then measured.

Then, epitaxial wafers for a heterojunction bipolar transistor in each of which the In composition x of the base layer decreased from the emitter layer toward the collector layer were fabricated.

As shown in Table 1, fabricated were the epitaxial wafers for a heterojunction bipolar transistor in which the difference between the maximum value and the minimum value of the In composition x of the base layer was varied among 0.04, 0.06, 0.08, and 0.10 and the mean value of the In composition x of the base layer spanning from the emitter layer to the collector layer was varied among 0.10, 0.12, 0.14, 0.16, 0.18, 0.20, and 0.22 for each of the aforementioned four types. The turn-on voltage of each of these epitaxial wafers for a heterojunction bipolar transistor was then measured.

When the difference between the maximum value and the minimum value of the In composition x of the base layer is no more than 0.06 and the mean value of the In composition x from the emitter layer to the collector layer is no less than 0.16 nor more than 0.22, the turn-on voltage can be reduced to equal to or less than a minimum value of the turn-on voltage in an epitaxial wafer for a heterojunction bipolar transistor according to a conventional technique.

On the basis of the above results, in the present invention, the difference between the maximum value and the minimum value of the In composition x of the base layer is set to equal to or less than 0.06, and the mean value of the In composition x of the base layer spanning from the emitter layer to the collector layer is set to no less than 0.16 nor more than 0.22.

What is claimed is:

1. An epitaxial wafer for a heterojunction bipolar transistor, the epitaxial wafer comprising:
    a collector layer made of GaAs;
    a base layer formed on the collector layer and made of InGaAs; and
    an emitter layer formed on the base layer and made of InGaP, and

TABLE 1

| | | In composition | | | | | | | |
|---|---|---|---|---|---|---|---|---|---|
| | | difference between maximum value and minimum value | | | | | | | |
| | | 0.04 | | 0.06 | | 0.08 | | 0.10 | |
| structure number | mean value | maximum value | minimum value | maximum value | minimum value | maximum value | minimum value | maximum value | minimum value |
| 1 | 0.10 | 0.12 | 0.08 | 0.13 | 0.07 | 0.14 | 0.06 | 0.15 | 0.05 |
| 2 | 0.12 | 0.14 | 0.10 | 0.15 | 0.09 | 0.16 | 0.08 | 0.17 | 0.07 |
| 3 | 0.14 | 0.16 | 0.12 | 0.17 | 0.11 | 0.18 | 0.10 | 0.19 | 0.09 |
| 4 | 0.16 | 0.18 | 0.14 | 0.19 | 0.13 | 0.20 | 0.12 | 0.21 | 0.11 |
| 5 | 0.18 | 0.20 | 0.16 | 0.21 | 0.15 | 0.22 | 0.14 | 0.23 | 0.13 |
| 6 | 0.20 | 0.22 | 0.18 | 0.23 | 0.17 | 0.24 | 0.16 | 0.25 | 0.15 |
| 7 | 0.22 | 0.24 | 0.20 | 0.25 | 0.19 | 0.26 | 0.18 | 0.27 | 0.17 |

Figure 3:
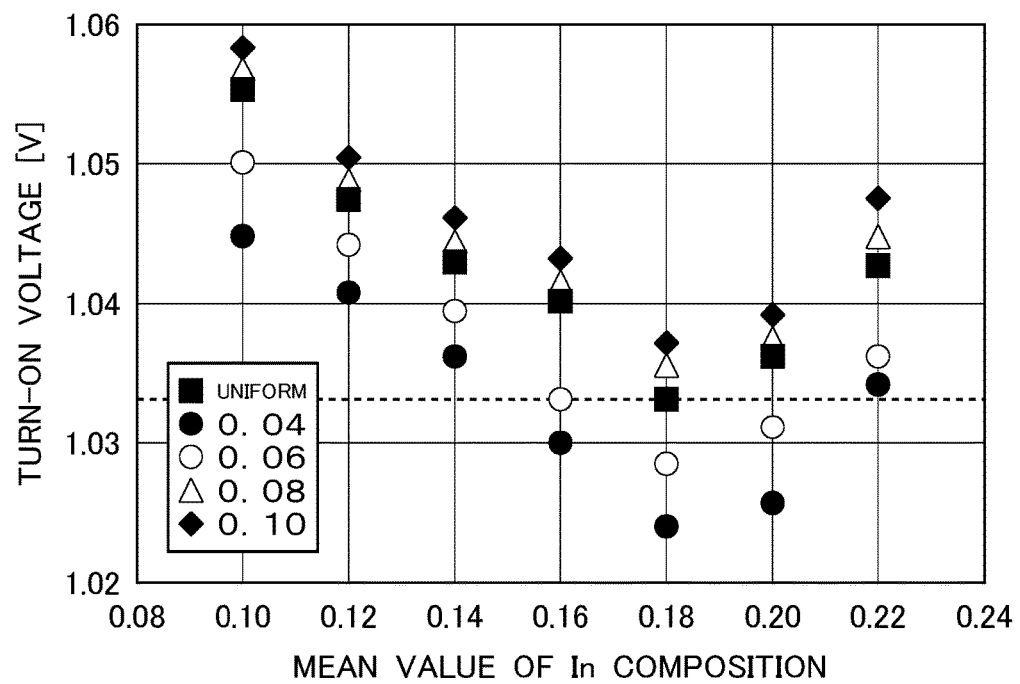
FIG. 3 illustrates a relationship between a mean value of an In composition of a base layer and a turn-on voltage when a difference between a maximum value and a minimum value of the In composition is varied.

The results are illustrated in FIG. 3. As can be seen from FIG. 3, the turn-on voltage decreases as the In composition x of the base layer increases, and the turn-on voltage reaches a minimum when the In composition x is 0.18. When the In composition x increases even further, the turn-on voltage inversely rises. The reason for this can be as follows. When the In composition x exceeds 0.18, the critical film thickness becomes thinner. Thus, when the film thickness of the base layer is set to 50 nm, then the film thickness of the base layer exceeds the critical film thickness. And for this reason, the crystallinity is degraded.

It should be noted that the turn-on voltage reaches a minimum when the In composition x is 0.18, and the In composition of the base layer at the interfacial surface between the base layer and the emitter layer at this point is 0.20.

On the basis of the above results, the In composition x of the base layer at the interfacial surface between the base layer and the emitter layer is set to 0.20 according to the present invention.

In a similar manner, the turn-on voltage decreases as the mean value of the In composition x of the base layer spanning from the emitter layer to the collector layer increases, and the turn-on voltage reaches a minimum when the mean value of the In composition x is 0.18. When the mean value of the In composition x increases even further, the turn-on voltage rises inversely.

the base layer having an In composition that decreases from the emitter layer toward the collector layer, a difference between a maximum value and a minimum value of the In composition of the base layer is equal to or less than 0.06.

2. The epitaxial wafer for a heterojunction bipolar transistor according to claim 1, wherein a mean value of the In composition of the base layer spanning from the emitter layer to the collector layer is no less than 0.16 nor more than 0.22.

3. The epitaxial wafer for a heterojunction bipolar transistor according to claim 1, wherein the In composition of the base layer at an interfacial surface between the base layer and the emitter layer is 0.20.

4. The epitaxial wafer for a heterojunction bipolar transistor according to claim 1, wherein the base layer has a film thickness that is equal to or less than a critical film thickness.

5. The epitaxial wafer for a heterojunction bipolar transistor according to claim 1, wherein the In composition of the base layer decreases continuously or in a stepwise manner from the emitter layer toward the collector layer.

6. A heterojunction bipolar transistor fabricated with the use of the epitaxial wafer for a heterojunction bipolar transistor according to claim 1.

7. The epitaxial wafer for a heterojunction bipolar transistor according to claim 2, wherein the In composition of the base layer at an interfacial surface between the base layer and the emitter layer is 0.20.

8. The epitaxial wafer for a heterojunction bipolar transistor according to claim 2, wherein the base layer has a film thickness that is equal to or less than a critical film thickness.

9. The epitaxial wafer for a heterojunction bipolar transistor according to claim 3, wherein the base layer has a film thickness that is equal to or less than a critical film thickness.

10. The epitaxial wafer for a heterojunction bipolar transistor according to claim 2, wherein the In composition of the base layer decreases continuously or in a stepwise manner from the emitter layer toward the collector layer.

11. The epitaxial wafer for a heterojunction bipolar transistor according to claim 3, wherein the In composition of the base layer decreases continuously or in a stepwise manner from the emitter layer toward the collector layer.

12. A heterojunction bipolar transistor fabricated with the use of the epitaxial wafer for a heterojunction bipolar transistor according to claim 3.

13. The epitaxial wafer for a heterojunction bipolar transistor according to claim 4, wherein the In composition of the base layer decreases continuously or in a stepwise manner from the emitter layer toward the collector layer.

14. A heterojunction bipolar transistor fabricated with the use of the epitaxial wafer for a heterojunction bipolar transistor according to claim 2.

* * * * *